(12) United States Patent
Song et al.

(10) Patent No.: US 11,424,317 B2
(45) Date of Patent: Aug. 23, 2022

(54) METHOD OF MANUFACTURING METAL NITRIDE FILM AND ELECTRONIC DEVICE INCLUDING METAL NITRIDE FILM

(71) Applicant: Samsung Electronics Co., Ltd., Suwon-si (KR)

(72) Inventors: Jeonggyu Song, Seongnam-si (KR); Kyooho Jung, Seoul (KR); Younsoo Kim, Yongin-si (KR); Haeryong Kim, Seongnam-si (KR); Jooho Lee, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/839,641

(22) Filed: Apr. 3, 2020

(65) Prior Publication Data
US 2021/0118982 A1    Apr. 22, 2021

(30) Foreign Application Priority Data
Oct. 21, 2019   (KR) .......................... 10-2019-0130813

(51) Int. Cl.
*H01L 27/108*  (2006.01)
*H01L 49/02*   (2006.01)
*H01L 21/285*  (2006.01)

(52) U.S. Cl.
CPC ........ *H01L 28/60* (2013.01); *H01L 21/28556* (2013.01); *H01L 27/10805* (2013.01)

(58) Field of Classification Search
CPC ............... H01L 28/60; H01L 21/28556; H01L 27/10805; H01L 21/32051; H01L 21/28562; H01L 27/10852; H01L 28/75; H01L 21/02172; H01L 21/02115;
(Continued)

(56) References Cited

U.S. PATENT DOCUMENTS 7,132,346 B2   11/2006  Kim
7,427,573 B2    9/2008  Lee et al.
7,723,771 B2    5/2010  Boescke et al.
(Continued)

FOREIGN PATENT DOCUMENTS

EP    1128417 A2    8/2001
JP    2002/64144 A  2/2002
(Continued)

OTHER PUBLICATIONS

A. Mason, Lecture Notes, <https://www.egr.msu.edu/classes/ece410/mason/files/Ch13.pdf> (archived on Feb. 19, 2018 from web.archive.org).
(Continued)

*Primary Examiner* — Duy T Nguyen
(74) *Attorney, Agent, or Firm* — Harness, Dickey & Pierce, P.L.C.

(57) ABSTRACT

A capacitor includes: a lower electrode including a metal nitride represented by MM'N, wherein M is a metal element, M' is an element different from M, and N is nitrogen; a dielectric layer on the lower electrode; an interfacial layer between the lower electrode and the dielectric layer and including a metal nitrate represented by MM'ON, wherein M is a metal element, M' is an element different from M, N is nitrogen, and O is oxygen; and an upper electrode on the dielectric layer.

21 Claims, 22 Drawing Sheets

(58) Field of Classification Search
CPC ............. H01L 51/0085; H01L 21/0228; H01L 21/28194; H01L 28/91; C23C 16/45534; C23C 16/34
USPC ........................................................ 257/296
See application file for complete search history.

(56) References Cited

U.S. PATENT DOCUMENTS

| | | | |
|---|---|---|---|
| 8,049,304 | B2 | 11/2011 | Srividya et al. |
| 8,125,038 | B2 | 2/2012 | Ahn et al. |
| 8,299,462 | B2 | 10/2012 | Srividya et al. |
| 8,581,319 | B2 | 11/2013 | Chen et al. |
| 8,737,036 | B2 | 5/2014 | Chen et al. |
| 9,082,611 | B2 | 7/2015 | Chung et al. |
| 9,105,646 | B2 | 8/2015 | Malhotra et al. |
| 9,281,357 | B2 | 3/2016 | Chen et al. |
| 9,437,419 | B2 | 9/2016 | Kim et al. |
| 9,502,238 | B2 | 11/2016 | Danek et al. |
| 9,536,940 | B2 | 1/2017 | Song et al. |
| 2002/0031032 | A1* | 3/2002 | Ooishi .................. G11C 5/143 365/226 |
| 2003/0057445 | A1 | 3/2003 | Kweon et al. |
| 2004/0009336 | A1 | 1/2004 | Marcadal et al. |
| 2008/0128772 | A1 | 6/2008 | Senzaki |
| 2010/0136313 | A1 | 6/2010 | Shimizu et al. |
| 2010/0207247 | A1* | 8/2010 | Kim ..................... H01L 28/40 257/532 |
| 2013/0078376 | A1 | 3/2013 | Higashino et al. |
| 2014/0080283 | A1* | 3/2014 | Song ................ H01L 21/02362 438/396 |
| 2016/0133837 | A1 | 5/2016 | Hsueh et al. |
| 2016/0172239 | A1* | 6/2016 | Padhi ............... H01L 21/02211 257/639 |
| 2016/0358998 | A1* | 12/2016 | Lim ........................ H01L 28/65 |
| 2018/0019300 | A1* | 1/2018 | Lee ........................ H01L 23/535 |
| 2018/0158688 | A1 | 6/2018 | Chen et al. |
| 2019/0148390 | A1* | 5/2019 | Frank ................ H01L 21/02181 257/295 |
| 2019/0161351 | A1 | 5/2019 | Song et al. |
| 2019/0333985 | A1* | 10/2019 | Lee .................... H01L 27/10811 |
| 2020/0273698 | A1 | 8/2020 | Song et al. |
| 2021/0159072 | A1 | 5/2021 | Lee et al. |

FOREIGN PATENT DOCUMENTS

| | | |
|---|---|---|
| JP | 2003/17581 A | 1/2003 |
| JP | 2003/229425 A | 8/2003 |
| JP | 2004/214668 A | 7/2004 |
| JP | 2013/151722 A | 8/2013 |
| JP | 2017174918 A | 9/2017 |
| KR | 100542247 B1 | 1/2006 |
| KR | 20060021096 A | 3/2006 |
| KR | 20160118968 A | 10/2016 |
| KR | 20180015305 A | 2/2018 |
| KR | 101967529 B1 | 4/2019 |
| KR | 2020-0104150 A | 9/2020 |
| KR | 10-2021-0065811 A | 6/2021 |

OTHER PUBLICATIONS

U.S. Appl. No. 16/791,189, filed Feb. 14, 2020.
Extended European Search Report dated Feb. 3, 2021, issued in corresponding European Patent Application No. 20174050.3.
Partial European Search Report dated Oct. 16, 2020 for corresponding European Application No. 20174050.3.
Office Action dated Apr. 4, 2022, issued in corresponding Japanese Patent Application No. 2020-173203.

* cited by examiner

METHOD OF MANUFACTURING METAL NITRIDE FILM AND ELECTRONIC DEVICE INCLUDING METAL NITRIDE FILM

CROSS-REFERENCE TO RELATED APPLICATION

This application claims the benefit of Korean Patent Application No. 10-2019-0130813, filed on Oct. 21, 2019, in the Korean Intellectual Property Office, the disclosure of which is incorporated herein in its entirety by reference.

BACKGROUND

1. Field

The present disclosure relates to a method of manufacturing a metal nitride film, and an electronic device including the metal nitride film.

2. Description of Related Art

With the down-scaling of an integrated circuit device, a space occupied by a capacitor has been reduced. A capacitor includes upper and lower electrodes and a dielectric film interposed between these electrodes. In order for the capacitor to exhibit high capacitance, dielectric materials having a high dielectric constant are used. The performance of the capacitor is influenced by electrode materials and manufacturing processes as well as dielectric constants of dielectric materials. During a high-temperature process for thin film deposition when manufacturing a capacitor, degradation of an electrode material may occur, thereby degrading the performance of the capacitor.

SUMMARY

Provided are methods of manufacturing a metal nitride film including a small amount of impurities.

Provides are capacitors having good electrical performance in which metal nitrides are used as electrode materials.

Additional aspects will be set forth in part in the description which follows and, in part, will be apparent from the description, or may be learned by practice of the presented embodiments of the disclosure.

According to an aspect of an embodiment, a capacitor includes: a lower electrode including a metal nitride represented by MM'N, wherein M is a metal element, M' is an element different from M, and N is nitrogen; a dielectric layer on the lower electrode; an interfacial layer between the lower electrode and the dielectric layer and the interfacial layer including a metal nitrate represented by MM'ON, wherein M is a metal element, M' is an element different from M, N is nitrogen, and O is oxygen; and an upper electrode on the dielectric layer.

In some embodiments, the content of carbon impurities in the lower electrode may be 1% or less.

In some embodiments, the content of carbon impurities in interfacial layer may be 1% or less.

In some embodiments, the M may be one of Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U.

In some embodiments, the M' may be one of H, Li, Be, B, N, O, Na, Mg, Al, Si, P, S, K, Ca, Sc, Ti, V, Cr, Mn, Fe, Co, Ni, Cu, Zn, Ga, Ge, As, Se, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U.

In some embodiments, the metal nitride may be represented as $M_xM'_yN_z$, where $0<x\leq2$, $0<y\leq2$, and $0<z\leq4$ may be satisfied.

In some embodiments, in the capacitor, the change range of capacitance C with respect to a bias voltage may be represented by Cmin≤C≤Cmax, and $C_{min}/C_{max}$ may be 0.9 or more.

According to an aspect of another embodiment, an integrated circuit device includes: a substrate; and one of the aforementioned capacitors on the substrate.

In some embodiments, the substrate may include: a semiconductor substrate; at least one conductive region formed on the semiconductor substrate; and an insulating film insulating the at least one conductive region.

In some embodiments, a memory device may include one of the aforementioned capacitors connected to a word line.

In some embodiments, a memory system may include the memory device, the capacitor may be connected to a transistor, and the capacitor and the transistor may be part of a memory cell.

According to an aspect of another embodiment, an electronic device may include one of the aforementioned capacitors connected to a transistor.

According to an aspect of an embodiment, a capacitor includes: a lower electrode including a metal nitride represented by MM'N, wherein M is a metal element, M' is an element different from M, and N is nitrogen; a dielectric layer on the lower electrode; and an upper electrode on the dielectric layer. A content of carbon impurities in the lower electrode may be 1% or less.

In some embodiments, the M may be one of Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U.

In some embodiments, the M' may be one of H, Li, Be, B, N, O, Na, Mg, Al, Si, P, S, K, Ca, Sc, Ti, V, Cr, Mn, Fe, Co, Ni, Cu, Zn, Ga, Ge, As, Se, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U.

In some embodiments, the metal nitride may be represented as $M_xM'_yN_z$, where $0<x\leq2$, $0<y\leq2$, and $0<z\leq4$ may be satisfied.

In some embodiments, in the capacitor, the change range of capacitance C with respect to a bias voltage may be represented by Cmin≤C≤Cmax, and $C_{min}/C_{max}$ may be 0.9 or more.

According to an aspect of another embodiment, an integrated circuit device includes: a substrate; and one of the aforementioned capacitors on the substrate.

In some embodiments, the substrate may include: a semiconductor substrate; at least one conductive region formed on the semiconductor substrate; and an insulating film insulating the at least one conductive region.

In some embodiments, a memory device may include one of the aforementioned capacitors connected to a word line.

In some embodiments, a memory system may include the memory device, the capacitor may be connected to a transistor, and the capacitor and the transistor may be part of a memory cell.

According to an aspect of another embodiment, an electronic device may include one of the aforementioned capacitors connected to a transistor.

According to an aspect of another embodiment, a method of manufacturing a metal nitride film includes: placing a substrate in a reaction chamber and supplying a first source including a metal organic ligand into a reaction chamber; performing a first purging of removing an organic ligand not being adsorbed on the substrate, among the first source; supplying a second source including a halogen compound into the reaction chamber; performing a second purging of removing an organic ligand not reacted with the second source; and supplying a nitridant into the reaction chamber.

In some embodiments, the metal organic ligand may be represented as $MR_x$ including a metal element M and an organic ligand R, and x may satisfy $0 < x \leq 6$.

In some embodiments, the M may be one of Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U.

In some embodiments, the R may include at least one of a C1-C10 alkyl group, a C2-C10 alkenyl group, a carbonyl group (C=O), halide, a C6-C10 aryl group, a C6-C10 cycloalkyl group, a C6-C10 cycloalkenyl group, (C=O)R (R is hydrogen or a C1-C10 alkyl group), a C1-C10 alkoxy group, C1-C10 amidinate, C1-C10 alkylamides, C1-C10 alkylimides, —N(Q)(Q') (Q and Q' are each independently a C1-C10 alkyl group or hydrogen), Q(C=O)CN (Q is hydrogen or a C1-C10 alkyl group), and C1-C10 β-diketonates.

In some embodiments, the halogen compound may be represented by $M'A_y$ (where y is a real number of greater than 0), and the M' may be one of H, Li, Be, B, N, O, Na, Mg, Al, Si, P, S, K, Ca, Sc, Ti, V, Cr, Mn, Fe, Co, Ni, Cu, Zn, Ga, Ge, As, Se, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U.

In some embodiments, the A may include at least one of F, Cl, Br, and I, and y may satisfy a range of $0 < y \leq 6$.

In some embodiments, the supplying of the first source, the supplying of the second source, and the supplying of the nitridant may be performed in an atomic layer deposition (ALD) process.

In some embodiments, the nitridant may be $NH_3$, $N_2H_2$, $N_3H$, or $N_2H_4$.

In some embodiments, the method may further include: performing heat treatment for removing a halogen element remaining as a reaction by-product from the halogen compound.

In some embodiments, the content of carbon impurities in the metal nitride film manufactured by the method may be 1% or less.

In some embodiments, the method may not include a supplying of a nitridant between the supplying the first source including the metal organic ligand and the supplying the second source including the halogen compound.

According to an aspect of another embodiment, a method of manufacturing an integrated circuit device includes: forming a metal nitride film on a substrate according to the aforementioned method; forming a dielectric layer on the metal nitride film; and forming an upper electrode on the dielectric layer.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
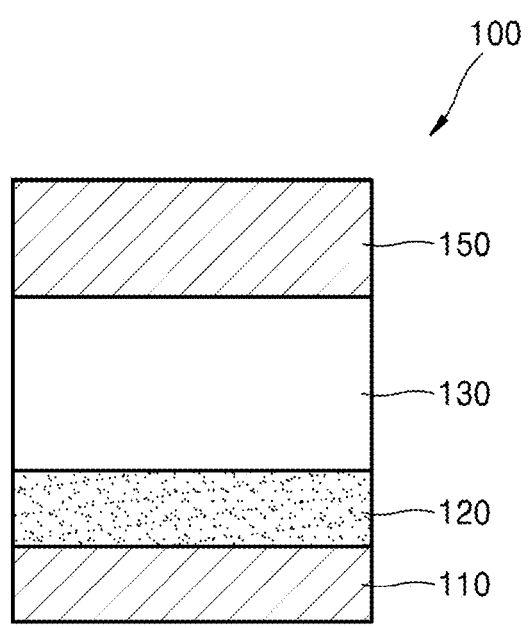
FIG. 1 is a schematic cross-sectional view of a capacitor according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the present disclosure will be described in detail with reference to the accompanying drawings. Embodiments are merely non-limiting examples, and various modifications are possible from these embodiments. In the following drawings, like numbers refer to like elements, and the size of each element may be exaggerated for clarity and convenience of description.

Hereinafter, when a part of a layer, film, region, plate, etc. is said to be "on" or "over" another part, it includes not only being directly on another part but also having another part therebetween.

Although the terms "first," "second," etc. may be used herein to describe various elements, these elements should not be limited by these terms. These terms are only used to distinguish one element from another element.

The singular forms "a," "an" and "the" are intended to include the plural forms as well, unless the context clearly indicates otherwise. When a part is said to "include" a component, this means that, unless specifically stated otherwise, it may further include other components rather than excluding other components.

The terms " . . . unit" and "module" described in the specification mean a unit that processes at least one function or operation, and may be implemented in hardware or software, or a combination of hardware and software.

The use of the term "above-described or aforementioned" and similar indicating terminology may correspond to both the singular form and the plural form.

The operations constituting the method may be performed in a suitable order, unless there is an explicit statement that they should be done in the order described. The use of all example terms (e.g., etc.) is merely for the purpose of describing the technical spirit in detail and is not intended to limit the scope of the rights as such terms are not limited by the claims.

FIG. 1 is a schematic cross-sectional view of a capacitor according to an embodiment.

A capacitor 100 includes a lower electrode 110, an upper electrode 150, and a dielectric layer 130 located between the lower electrode 110 and the upper electrode 150. An interfacial layer 120 is located between the lower electrode 110 and the dielectric layer 130.

The lower electrode 110 includes a metal nitride represented as MM'N. Here, M is a metal element, M' is an element different from M, and N is nitrogen.

The metal nitride MM'N constituting (or included in) the lower electrode 110 may be represented as a metal nitride MN doped with the element M'. M' is an element different from M. M' may be a metal, but is not limited thereto, and may be a material other than metals.

M may be any one selected from Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U.

M' may be any one selected from H, Li, Be, B, N, O, Na, Mg, Al, Si, P, S, K, Ca, Sc, Ti, V, Cr, Mn, Fe, Co, Ni, Cu, Zn, Ga, Ge, As, Se, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U.

The material of the lower electrode 110 is selected to ensure conductivity as an electrode and maintain stable capacitance performance even after a high-temperature process in the process of manufacturing the capacitor 100.

In the metal nitride MM'N, when the composition ratio of M, M', and N is x:y:z, $0<x\leq2$, $0<y\leq2$, and $0<z\leq4$ may be satisfied. In other words, the metal nitride may be represented by the formula $M_xM'_yN_z$. Electrical characteristic of the capacitor 100 as well as electrical conductivity thereof may be changed depending on the composition ratio. This composition is a factor influencing the material composition of the interfacial layer 120 because the interfacial layer 120 may be a major cause of a change in capacitance according to a bias voltage. The composition ratio may be changed depending on the specific selection of M and M'.

In an atomic layer deposition (ALD) process used to prepare metal nitrides, as a source of metal materials, a metal organic ligand material is used as a precursor. In this case, when an organic ligand is not easily removed after a metal material is applied on a target surface, carbon impurities are included in a metal nitride film, thereby causing a deterioration in performance of a capacitor. In the capacitor 100 according to an embodiment, as described above, the metal nitride MM'N is used as a material of the lower electrode 110. Further, according to a manufacturing method to be described later, the metal nitride MM'N, which has almost no carbon impurities, is employed in the lower electrode 110. The content of carbon in the material of the lower electrode 110 may be about 1% or less.

The interfacial layer 120 includes a metal nitrate represented by MM'ON. Here, M is a metal element, M' is an element different from M, N is nitrogen, and O is oxygen. M and M', each of which is any one of the example materials, are the same as M and M' included in the metal nitride MM'N of the lower electrode 110, respectively.

The interfacial layer 120 is formed by surface oxidation of the lower electrode 110 during a high-temperature process in the process of forming the dielectric layer 130 on the lower electrode 110. The thickness of the interfacial layer 120 may be less than the thickness of the lower electrode 110.

The interfacial layer 120 causes the performance of the capacitor 100 to degrade because the interfacial layer 120 hardly functions as an electrode and does not form a high-quality dielectric film. Further, a depletion layer may be formed in the interfacial layer 120 during the operation of the capacitor 100, and such a depletion layer may cause performance degradation of the capacitor 100, for example, capacitance degradation of the capacitor 100, particularly in negative bias.

In the capacitor 100 according to an embodiment, as described above, the metal nitride represented by MM'N and having almost no impurities is used as the material of the lower electrode 110, and thus the metal nitrate MM'ON constituting (or included in) the interfacial layer 120 may have almost no carbon impurities, for example, a carbon impurity content of about 1% or less (e.g., equal to or greater than 0% and less than or equal to 1%). The degradation in capacitance of the capacitor 100 by the interfacial layer 120 may be reduced.

The dielectric layer 130 may be formed of a material and a thickness capable of realizing a desired capacitance. As the degree of integration of an integrated circuit device including the capacitor 100 increases, a space occupied by the capacitor 100 gradually decreases, and thus a dielectric having a high dielectric constant may be preferred.

The dielectric layer 130 may include a material having a high dielectric constant. The 'high dielectric constant' refers to a dielectric constant higher than that of silicon oxide. In the dielectric layer 130, a metal oxide including at least one metal selected from hafnium (Hf), zirconium (Zr), aluminum (Al), niobium (Nb), cerium (Ce), lanthanum (La), tantalum (Ta), and titanium (Ti) may be used. The dielectric layer 130 may include $HfO_2$, $ZrO_2$, $Al_2O_3$, $CeO_2$, $La_2O_3$, $Ta_2O_3$, or $TiO_2$. The dielectric layer 130 may have a single-layer structure as shown in the drawings, but is not limited thereto, and may have a multi-layer structure.

The upper electrode 150 may include a metal, a metal nitride, a metal oxide, or a combination thereof. For example, the upper electrode 150 may include, but is not limited to, TiN, MoN, CoN, TaN, TiAlN, TaAlN, W, Ru, $RuO_2$, $SrRuO_3$, Ir, $IrO_2$, Pt, PtO, SRO($SrRuO_3$), BSRO((Ba,Sr)$RuO_3$), CRO(Ca$RuO_3$), LSCO((La,Sr)$CoO_3$), or a combination thereof. The upper electrode 150 may be a different material than the lower electrode 110, but inventive concepts are not limited thereto.

Figure 2:
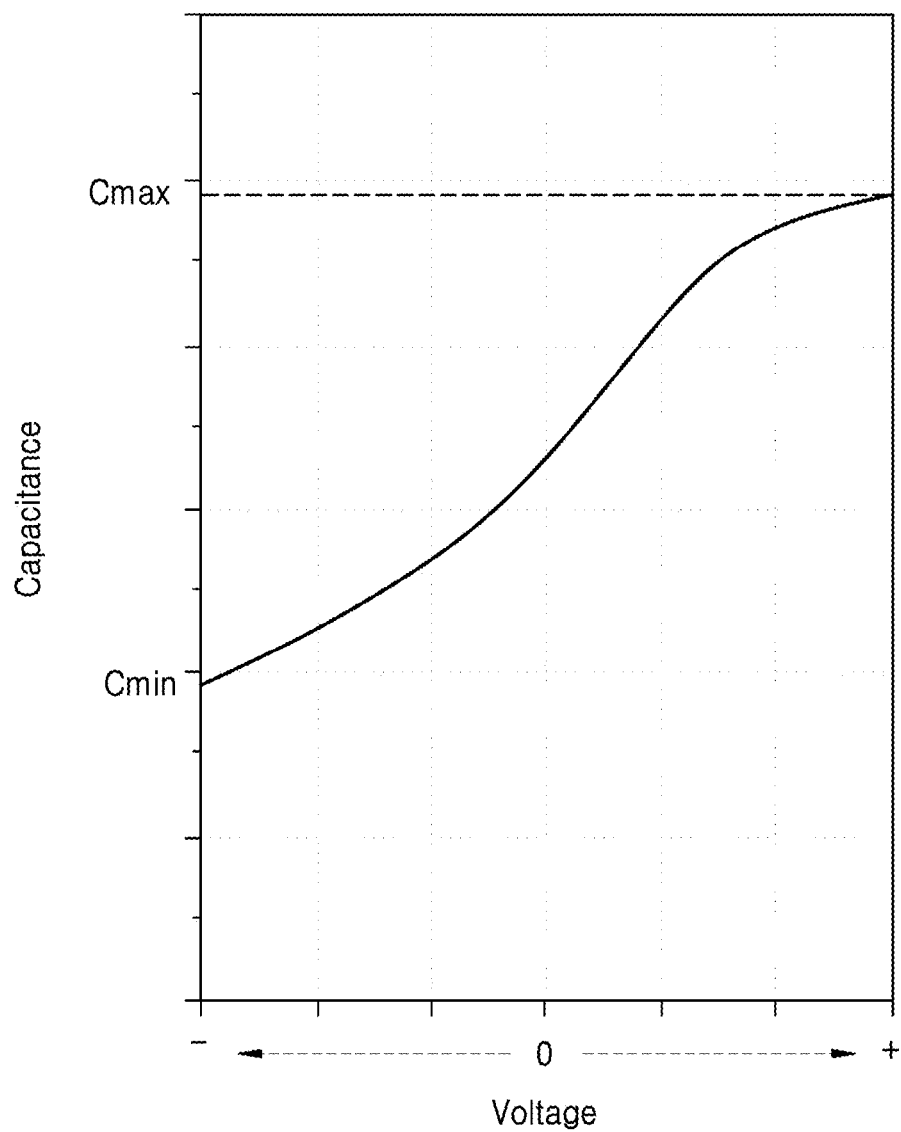
FIG. 2 is a graph conceptually illustrating a change in capacitance of the capacitor according to an embodiment with respect to a bias voltage.

FIG. 2 is a graph conceptually illustrating a change in capacitance of the capacitor according to an embodiment with respect to a bias voltage.

In the graph of FIG. 2, and also referring to FIG. 1, the dashed line represents ideal capacitance which can be realized by the dielectric layer 130. The ideal capacitance shows a constant value independent of the bias voltage.

In contrast, the solid line shows capacitance changing depending on the bias voltage during the actual operation of the capacitor. When the bias voltage changes in a negative (−) direction, capacitance is lowered due to a depletion layer formed inside the capacitor 100. The change range of capacitance C with respect to the bias voltage may be represented by $C_{min} \leq C \leq C_{max}$. The capacitor 100 according to an embodiment employs a structure in which performance deterioration caused by the depletion layer is reduced, and thus, may have an increased $C_{min}$ value. In other words, the capacitor 100 according to an embodiment may employ a metal nitride film MN doped with M' in the lower electrode 110, and in this case, the content ratio of M' and M may be adjusted so as to satisfy conductivity and electrical characteristics required for (and/or desired for) a capacitor, so that the state of the interfacial layer 120 between the lower electrode 110 and the dielectric layer 130 may be a state in which a depletion layer is less likely to occur. As a result, the capacitor 100 may have an improved $C_{min}$ value, and may have high $C_{min}/C_{max}$. $C_{min}/C_{max}$ may be 0.9 or more (e.g., in a range of 0.9 to 1.0).

In the capacitor 100 in FIG. 1, forming the lower electrode 110 with the metal nitride represented by MM'N may increases $C_{min}/C_{max}$ and may make a depletion layer less likely to occur in the interfacial layer 120 between the lower electrode 110 and the dielectric layer 130. On the other hand, while the upper electrode 150 may also be formed using the metal nitride represented by MM'N and/or the same material as the lower electrode 110, forming the upper electrode 150 with the metal nitride represented by MM'N may not have the same effect on increasing Cmin/Cmax of the capacitor 100 because the upper electrode 150 may be formed after the interfacial layer 120. However, there may be an effect of increasing capacitance of the capacitor 100 at positive bias when the lower electrode 110 and upper electrode 150 both are formed of the same metal nitride represented by MM'N.

Figure 3:
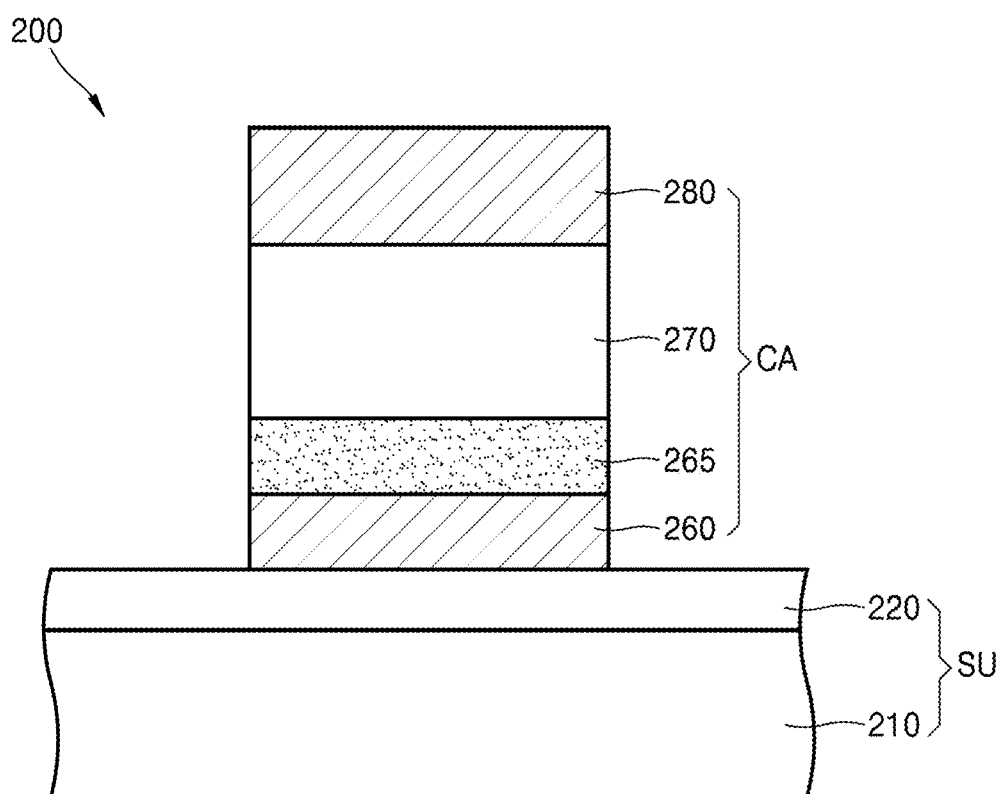
FIG. 3 is a schematic cross-sectional view of an integrated circuit device according to an embodiment.

FIG. 3 is a schematic cross-sectional view of an integrated circuit device according to an embodiment.

An integrated circuit device 200 includes a substrate SU and a capacitor CA formed on the substrate SU.

The substrate SU may include a semiconductor element such as Si or Ge, or a compound semiconductor such as SiC, GaAs, InAs, or InP. The substrate SU may include a pattern of a conductive region and an insulating film.

As illustrated, the substrate SU may include a semiconductor substrate 210 and a lower structure 220 formed on the semiconductor substrate 210.

The semiconductor substrate 210 may include a plurality of active regions and an element separation film that separates the plurality of active regions. The semiconductor substrate 210 may have various element separation structures such as a shallow trench isolation (STI) structure.

The lower structure 220 may include at least one conductive region and an insulating film insulating the same. The conductive region may be formed of, for example, a well doped with impurities or a structure doped with impurities. The lower structure 220 may include various conductive regions, for example, a wiring layer, a contact plug, a transistor, and an insulating film that insulates these regions from each other. The conductive regions may be made of polysilicon, metal, conductive metal nitride, metal silicide, or a combination thereof. The insulating film may be a silicon oxide film, a silicon nitride film, or a combination thereof.

The capacitor CA may include a lower electrode 260, an interfacial layer 265, a dielectric layer 270, and an upper electrode 280.

The capacitor CA may be formed to be electrically connected to the conductive region formed on the substrate SU, and may be formed on the conductive region formed on the substrate SU.

The lower electrode 260 includes a metal nitride represented as MM'N. Here, M is a metal element, M' is an element different from M, and N is nitrogen. The aforementioned M and M' may be included in the metal nitride.

The interfacial layer 265 includes a metal nitrate represented by MM'ON. Here, M is a metal element, M' is an element different from M, N is nitrogen, and O is oxygen. M and M', each of which is any one of the example materials, are the same as M and M' included in the metal nitride MM'N of the lower electrode 260, respectively.

The interfacial layer 265 is formed by surface oxidation of the lower electrode 260 during a high-temperature process in the process of forming the dielectric layer 270 on the lower electrode 260. The thickness of the interfacial layer 265 may be less than the thickness of the lower electrode 260.

The dielectric layer 270 may include a material having a high dielectric constant. The 'high dielectric constant' refers to a dielectric constant higher than that of silicon oxide, for example, may refer to a dielectric constant higher than that of a material of an insulating film included in the substrate SU.

The upper electrode 280 may include a metal, a metal nitride, a metal oxide, or a combination thereof.

The capacitor CA is different from the capacitor 100 illustrated in FIG. 1 in that the capacitor CA is formed in a shape constituting a predetermined integrated circuit together with patterns such as a conductive region and an insulating film included in the substrate SU, and other elements of the capacitor CA are the same as those of the capacitor 100.

Although FIG. 3 shows only one capacitor CA, the integrated circuit device 200 may include a plurality of capacitors using the metal nitride film MM'N as a lower electrode material.

The capacitor CA provided in the integrated circuit device 200 may exhibit a small change in capacitance due to a bias voltage, that is, stable electrical performance, and thus the capacitor CA is advantageous in increasing the degree of integration of the integrated circuit device 200 and improving the performance of the integrated circuit device 200.

In some embodiments, the capacitor 100 in FIG. 1 and/or the capacitor CA in FIG. 3 may be used as a capacitor in a DRAM device, such as where the lower electrode 110 (or 260) and capacitor 100 (or CA) may be applied to a memory cell of a DRAM device, but inventive concepts are not limited thereto.

Referring to FIGS. 1 and 3, in some embodiments, the lower electrodes 110 and/or 260 may have a thickness of about 2 nm to about 10 nm, the interfacial layers 120 and/or 265 may have a thickness of about 0.5 nm to about 2 nm, the dielectric layers 130 and/or 270 may have a thickness of about 4 nm to about 7 nm, and the upper electrodes 150 and 280 may have a thickness of about 2 nm to about 10 nm. However, inventive concepts are not limited thereto.

Figure 4:
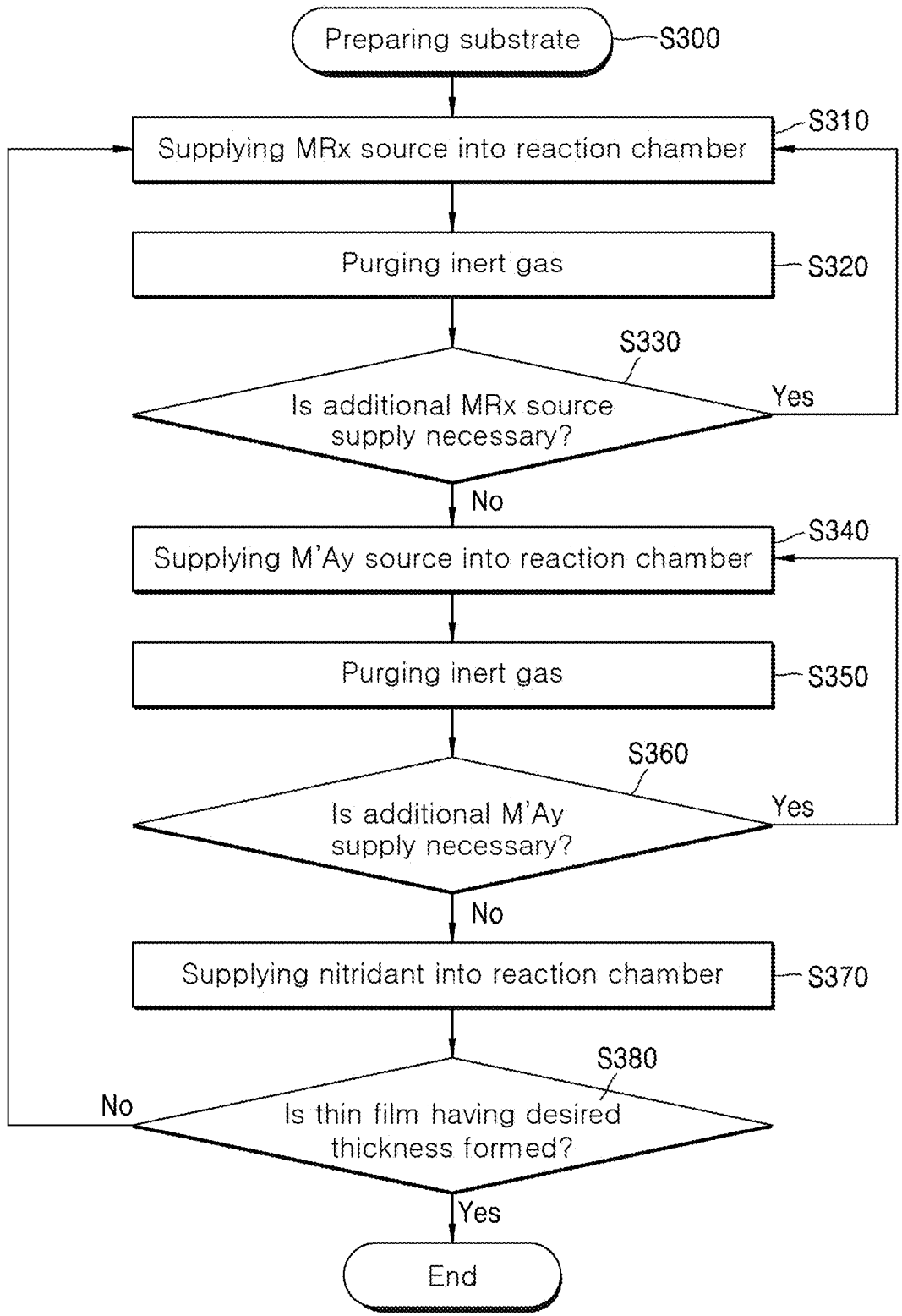
FIG. 4 is a flowchart illustrating a method of manufacturing a metal nitride film according to an embodiment.

FIG. 4 is a flowchart illustrating a method of manufacturing a metal nitride film according to an embodiment, and FIGS. 5A to 5H are views conceptually illustrating the respective operations of a method of manufacturing a metal nitride film according to an embodiment.

In order to form a metal nitride film, a substrate SU having a target surface on which the metal nitride film is to be formed is prepared (S300).

The substrate SU is a substrate suitable for implementing an integrated circuit. As described above, the substrate SU may include a semiconductor element, a plurality of conductive regions, and patterns of an insulating film.

Next, the substrate SU is placed in a reaction chamber, and a first source including a metal organic ligand is supplied to the reaction chamber (S310).

The metal organic ligand is MRx including a metal element M and an organic ligand R. Here, x may satisfy $0 < x \leq 6$.

M is any one selected from Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U.

R may include at least one selected from a C1-C10 alkyl group, a C2-C10 alkenyl group, a carbonyl group (C=O), halide, a C6-C10 aryl group, a C6-C10 cycloalkyl group, a C6-C10 cycloalkenyl group, (C=O)R (R is hydrogen or a C1-C10 alkyl group), a C1-C10 alkoxy group, C1-C10 amidinate, C1-C10 alkylamides, C1-C10 alkylimides, —N(Q)(Q') (Q and Q' are each independently a C1-C10 alkyl group or hydrogen), Q(C=O)CN (Q is hydrogen or a C1-C10 alkyl group), and C1-C10 β-diketonates.

An atomic layer deposition (ALD) process may be used as the process of supplying the first source. The ALD process may be performed at a temperature of about 100° C. to about 500° C., where the temperature may refer to a temperature of the substrate during the ALD process, and the process temperature of the substrate SU and/or another temperature (e.g., a process chamber wall temperature sensed by a thermosensor in the chamber) may be set in consideration of thermal stability of the metal organic ligand. Considering that the metal organic ligand having low thermal stability may be decomposed at a high temperature, the ALD process may be performed at a temperature of about 400° C. or lower.

Figure 5A:
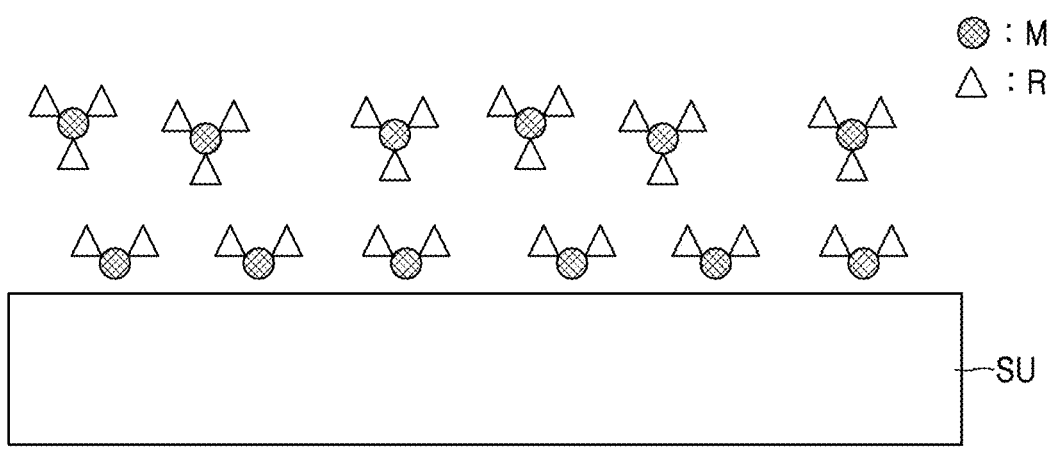
FIGS. 5A to 5H are views conceptually illustrating the respective operations of a method of manufacturing a metal nitride film according to an embodiment.

As shown in FIG. 5A, metal organic ligands are supplied onto the substrate SU placed in the reaction chamber.

Among the metal organic ligands provided to the reaction chamber, organic ligands which are not adsorbed onto the substrate SU may be removed by purging. The purging is a process of discharging organic ligands that do not participate in a reaction or organic ligands that are by-products after participating in the reaction to the outside. Inert gas such as Ar, He, Ne, or $N_2$ gas may be used for purging.

Figure 5B:
Figure 5B:
Figure 5B:
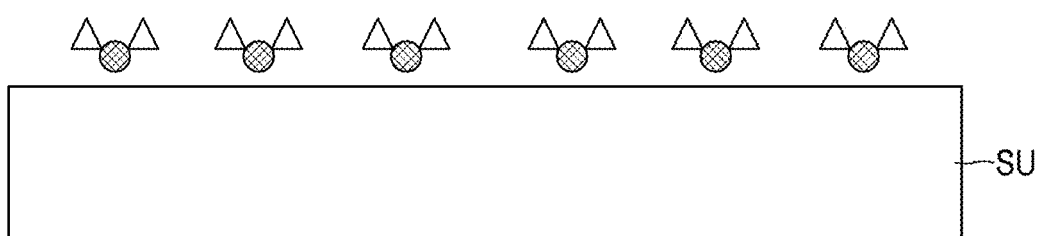

As shown in FIG. 5B, the metal organic ligands are adsorbed onto the substrate SU.

The process of FIGS. 5A and 5B may be represented by Formulas 1 and 2 below.

(1)

(2)

Formula (2) indicates that residual ligand components x*aR are removed by purging.

Next, whether additional $MR_x$ supply is necessary or desired is determined (S330). When additional $MR_x$ supply is necessary (and/or desired), operations S310 and S320 may be repeated. When additional Mrx supply is not needed, operation 340 may be performed.

Next, a second source including a halogen compound is supplied to the reaction chamber (S340). An atomic layer deposition (ALD) process may be used as the process of supplying the second source. The ALD process may be performed at a temperature of about 100° C. to about 500° C., and the process temperature may be set in consideration of thermal stability of the metal organic ligand. Considering that the metal organic ligand having low thermal stability may be decomposed at high temperature, the ALD process may be performed at a temperature of about 400° C. or lower.

A process of supplying a nitridant may not be provided between the operation S310 of supplying the first source including the metal organic ligands and the operation S340 of supplying the second source including the halogen compound.

The halogen compound may be represented as M'Ay (y is a real number greater than 0) including the halogen element A.

A may include at least one selected from F, Cl, Br, and I, and y may satisfy a range of $0 < y \leq 6$.

M' may be any one selected from H, Li, Be, B, N, O, Na, Mg, Al, Si, P, S, K, Ca, Sc, Ti, V, Cr, Mn, Fe, Co, Ni, Cu, Zn, Ga, Ge, As, Se, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U.

Next, organic ligands that has not reacted with the halogen compound are removed by purging. Inert gas such as Ar, He, Ne, or $N_2$ gas may be used for purging. In this operation, the halogen compound not participating in the reaction and reaction by-products may be removed together.

Figure 5C:
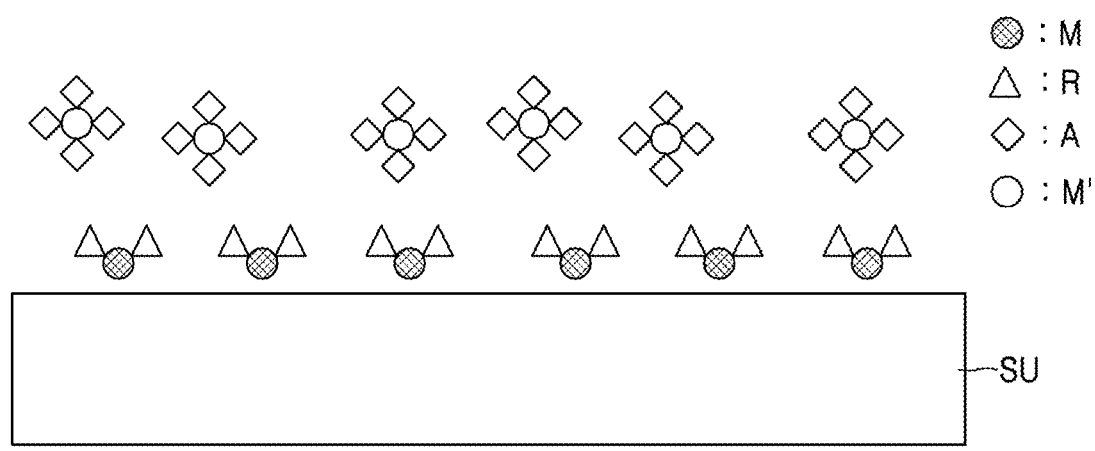
Figure 5D:
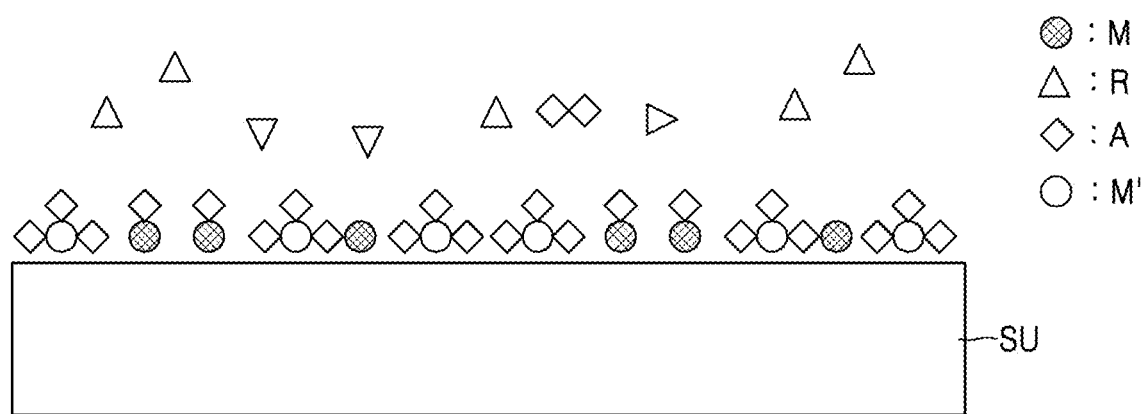
Figure 5E:
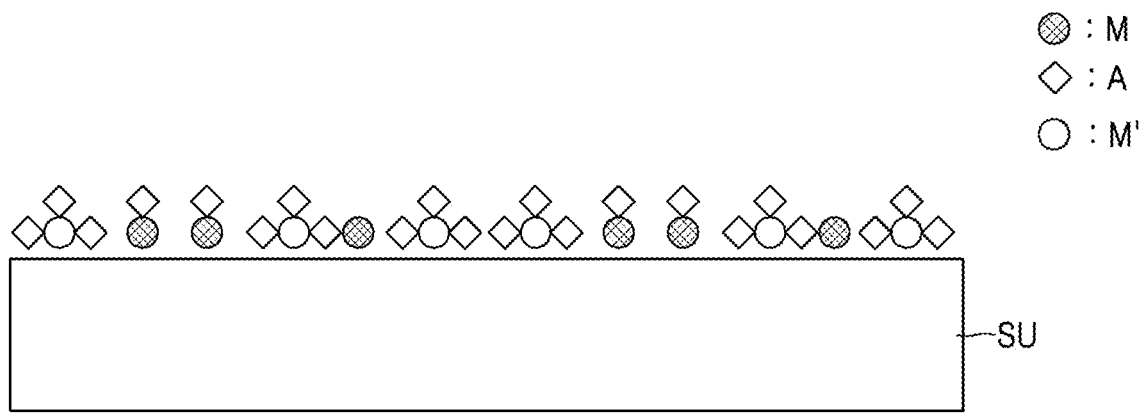

The operation S340 of supplying the second source including the halogen compound and the operation S350 of purging the residual halogen compound and the by-products are shown in FIGS. 5C to 5E, and may be represented by Formulae below.

(3)

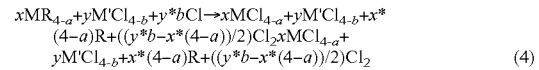

(4)

(5)

In Formulae above, Cl is a non-limiting example as the halogen element A, and Formula (5) indicates that residual ligand components and reaction by-products are removed by purging.

As shown in FIG. 5E, M supplied by the first source and M' supplied by the second source are adsorbed onto the substrate SU in a state of being bonded to the halogen element A.

Next, whether additional $M'A_y$ source supply is necessary (and/or desired) is determined (S360), and if necessary (and/or desired), operations S340 and S350 may be repeated.

Figure 5F:
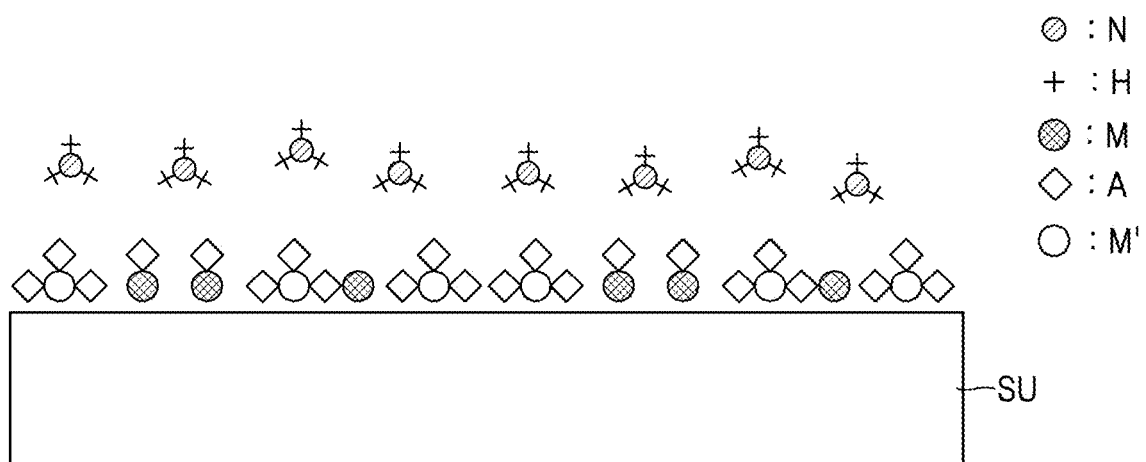

Next, as shown in FIG. 5F, the nitridant is supplied to the reaction chamber (S370). The ALD process may be used as the process of supplying the nitridant, and may be performed at a temperature of about 100° C. to about 500° C.

The nitridant is a reaction gas including a nitrogen element, and may include at least one selected from $NH_3$, $N_2H_2$, $N_3H$, and $N_2H_4$.

The nitridant reacts with M bonded with halogen element A and M' bonded with halogen element A, and a metal nitride film MM'N is formed on the substrate SU. Reaction by-products including halogen elements are mostly vaporized by the process temperature.

Figure 5G:
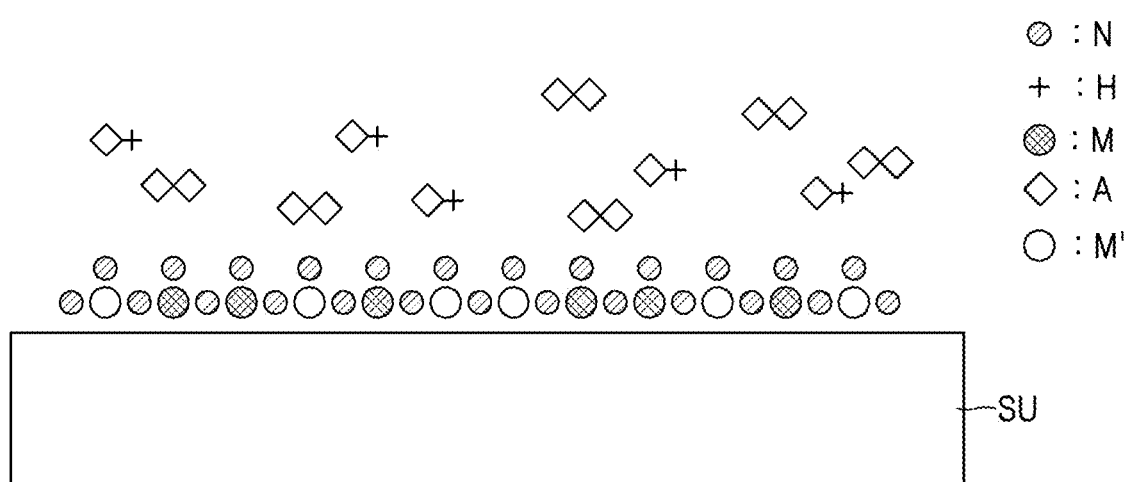
Figure 5H:
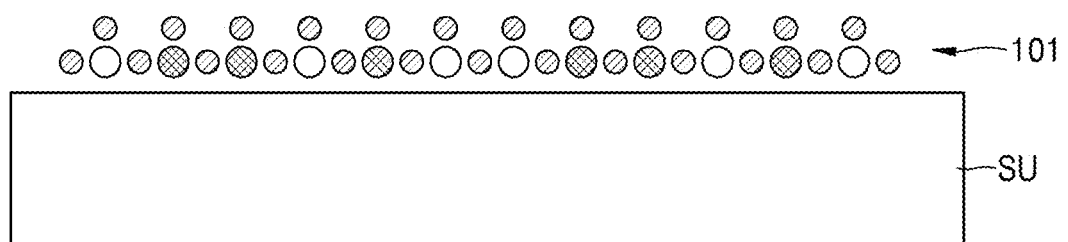

The supply of the nitridant and the reaction with the nitridant are shown in FIGS. 5F to 5H, and may be represented by Formula below.

$$xMCl_{4-a} + yM'Cl_{4-b} + zNH_c \rightarrow M_xM'_yN_z + (z^*c)HCl + ((x^*(4-a) + y^*(4-b) - z^*c)/2)Cl_2 \qquad (6)$$

Whether the metal nitride film MM'N is formed to have a desired thickness is determined, and if necessary (and/or desired), operations S310 to S370 may be repeated.

After the operation S370 of supplying the nitridant to the reaction chamber, heat treatment may be additionally performed to remove the halogen elements remaining as reaction byproducts from the halogen compound. A heat treatment temperature may be about 200° C. to about 1000° C.

A metal nitride film 101 formed according to this operation has a very low content of impurities other than MM'N. Since almost all of the organic ligands included in the source used to form MM'N are removed, the metal nitride film 101 includes almost no carbon impurities. These results are shown in the processes of Formulae (1) to (6). The content of carbon impurities in the metal nitride film 101 formed in this process may be about 1% or less. Unlike this, in conventional methods, ligands or reaction by-products may inevitably remain. This phenomenon will be described later with reference to FIGS. 6A to 6C for a comparative embodiment. As the content of impurities increases, the metal nitride film exhibits high resistivity, and thus the metal nitride film is not suitable for functioning as an electrode. The resistivity of the metal nitride film may be changed in a range of several hundred times depending on the content of impurities. The metal nitride film MM'N, which is manufactured according to the method of the embodiment and has almost no impurities, may exhibit low resistivity, and may be used as an excellent electrode material.

The method of manufacturing a metal nitride film according to an embodiment does not include the operation of directly reacting the metal organic ligand with the nitridant, and thus a metal nitride film having better quality may be formed.

Figure 6A:
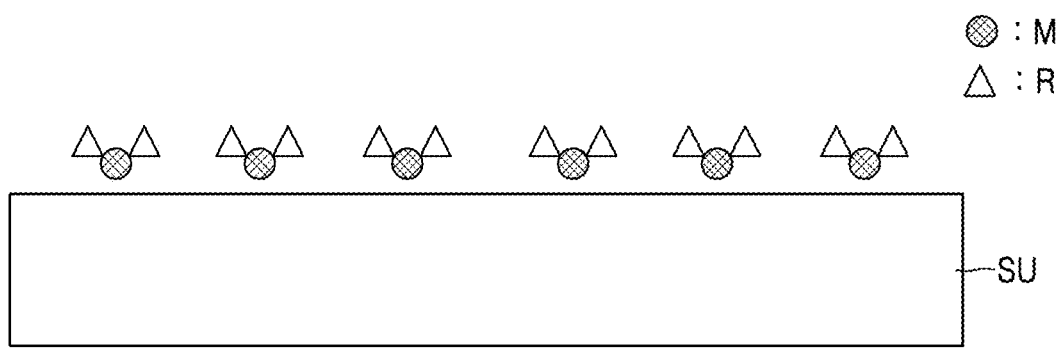
FIGS. 6A to 6C are views conceptually illustrating a method of manufacturing a metal nitride film according to a comparative embodiment.
Figure 6B:
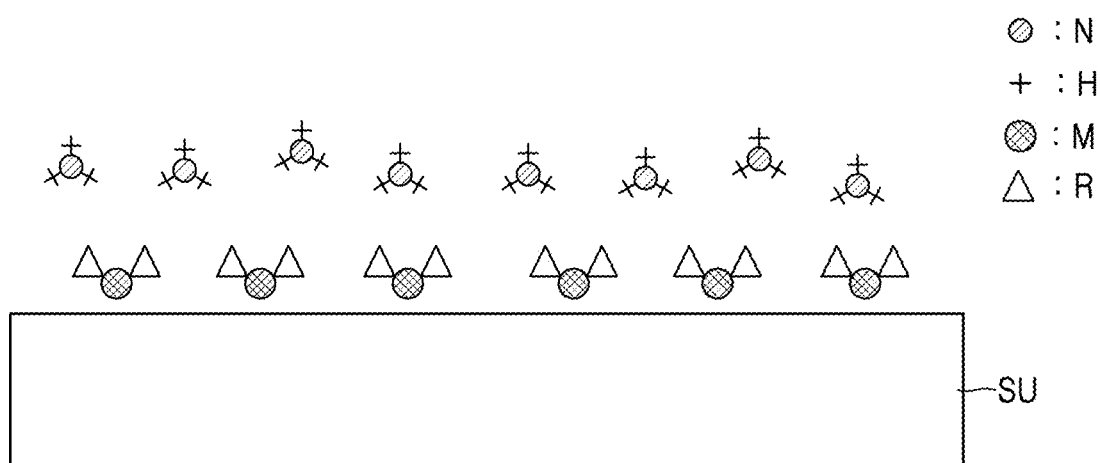
Figure 6C:
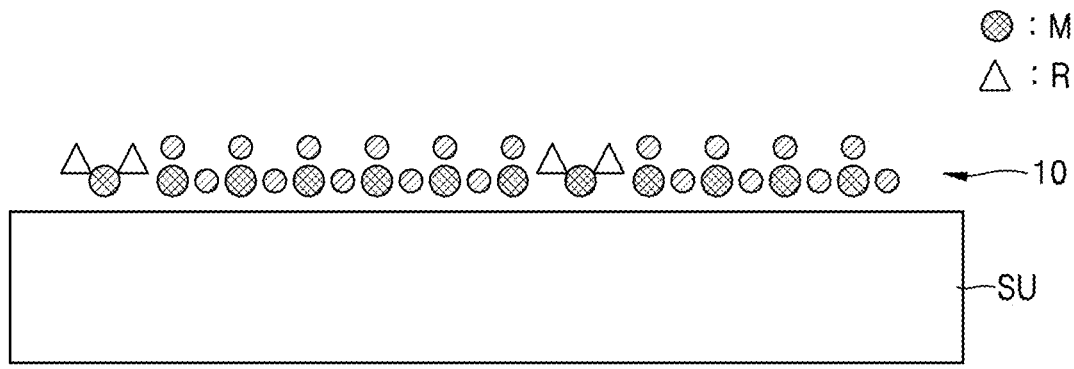

FIGS. 6A to 6C are views conceptually illustrating a method of manufacturing a metal nitride film according to a comparative embodiment.

As shown in FIG. 6A, metal organic ligands $MR_x$ are supplied into a reaction chamber provided with a substrate SU, and organic ligands not adsorbed on the substrate SU are purged, so that the metal organic ligands are adsorbed on the substrate SU. This process may be represented by Formula below.

$$MR_4 \rightarrow MR_{4-a} + aR \qquad (7)$$

Next, as shown in FIG. 6B, a nitridant $NH_3$ is supplied. This process may be performed by an ALD process. In this case, $NH_3$ and $MR_x$ have low reactivity, and thus, the ALD process should be performed at high temperature. In a high-temperature process for increasing the reactivity of $NH_3$ and $MR_x$, the metal organic ligands may be decomposed by low thermal stability of the metal organic ligands.

Due to such a limitation, the metal nitride in which a metal of the metal organic ligand reacts with nitrogen of the nitridant may include impurities resulted from that the organic ligands are not removed well even after purging. This process may be represented by Formula below.

$$MR_{4-a} + bNH_3 \rightarrow MC_xN_y + dR' \qquad (8)$$

The metal nitride film 10 manufactured as shown in FIG. 6C may include carbon impurities other than MN, and thus the metal nitride film 10 may exhibit high resistivity. The electrical performance of a capacitor using such a metal nitride film MN as an electrode material may be degraded. For example, as described above with reference to FIG. 2, the capacitance of the capacitor with respect to a bias voltage may be greatly degraded. That is, as compared with the capacitor according to an embodiment, the capacitor according to a comparative embodiment may exhibit a lower $C_{min}$ value, or may exhibit a lower $C_{min}/C_{max}$ value.

FIGS. 7A to 7D are views illustrating a method of manufacturing an integrated circuit device according to an embodiment.

Figure 7A:
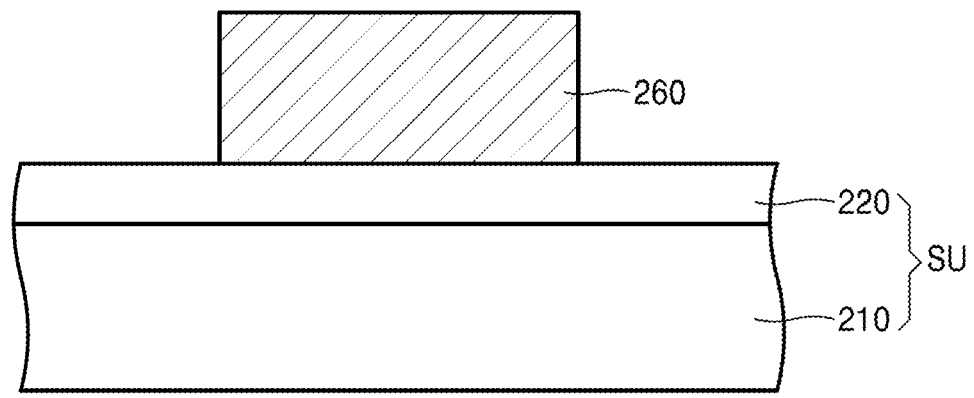
FIGS. 7A to 7D are views illustrating a method of manufacturing an integrated circuit device according to an embodiment.

As shown in FIG. 7A, a lower electrode 260 is formed on a substrate SU.

The substrate SU is a substrate suitable for implementing an integrated circuit. As described above, the substrate SU may include a semiconductor element, a plurality of conductive regions, and patterns of an insulating film.

The lower electrode 260 may be formed by forming a metal nitride film 101 including MM'N having almost no impurities according to the method described with reference to FIGS. 5A to 5H and then patterning the metal nitride film 101 in a desired shape. The lower electrode 260 may have a pattern corresponding to the conductive region provided in the substrate SU.

Figure 7B:
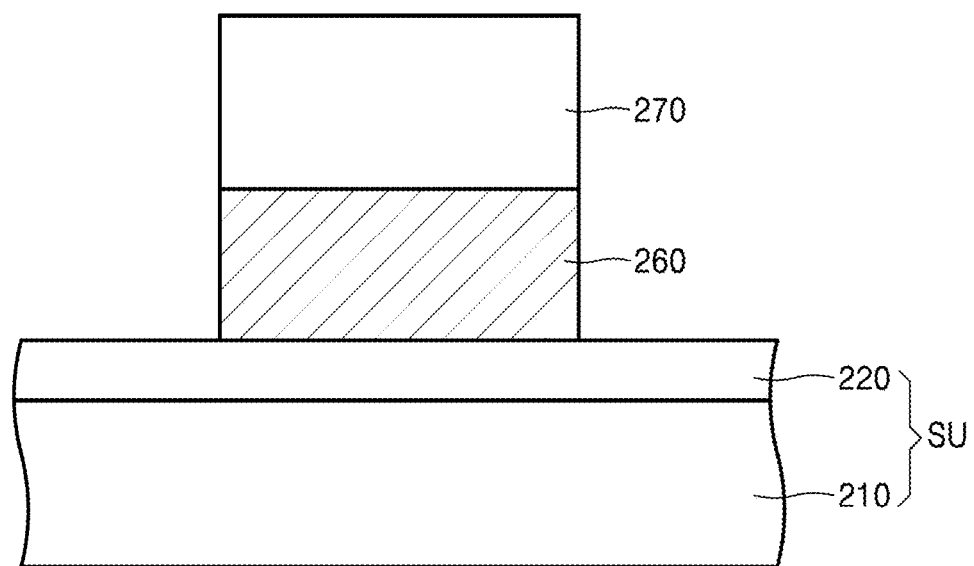
Figure 7C:
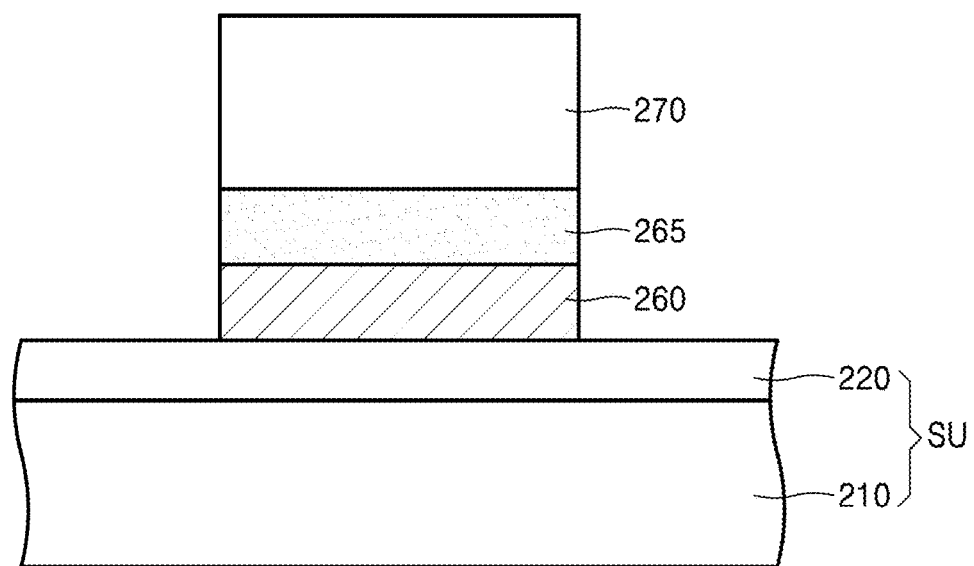

Next, as shown in FIG. 7B, a dielectric layer 270 is formed on the lower electrode 260. The dielectric layer 270 may be formed by an ALD process. The dielectric layer 270 may be deposited to entirely cover the lower electrode 260, and then may be patterned in a pattern corresponding to the lower electrode 260. However, the formation of the dielectric layer 270 is not limited to this method.

In the ALD process of forming the dielectric layer 270, a part of the surface of the lower electrode 260 may be oxidized to form an interfacial layer 265.

The interfacial layer 265 includes a metal nitrate represented by MM'ON. Here, M is a metal element, M' is an element different from M, N is nitrogen, and O is oxygen. M and M' are the same as M and M' included in the metal nitride MM'N of the lower electrode 260, respectively.

Figure 7D:
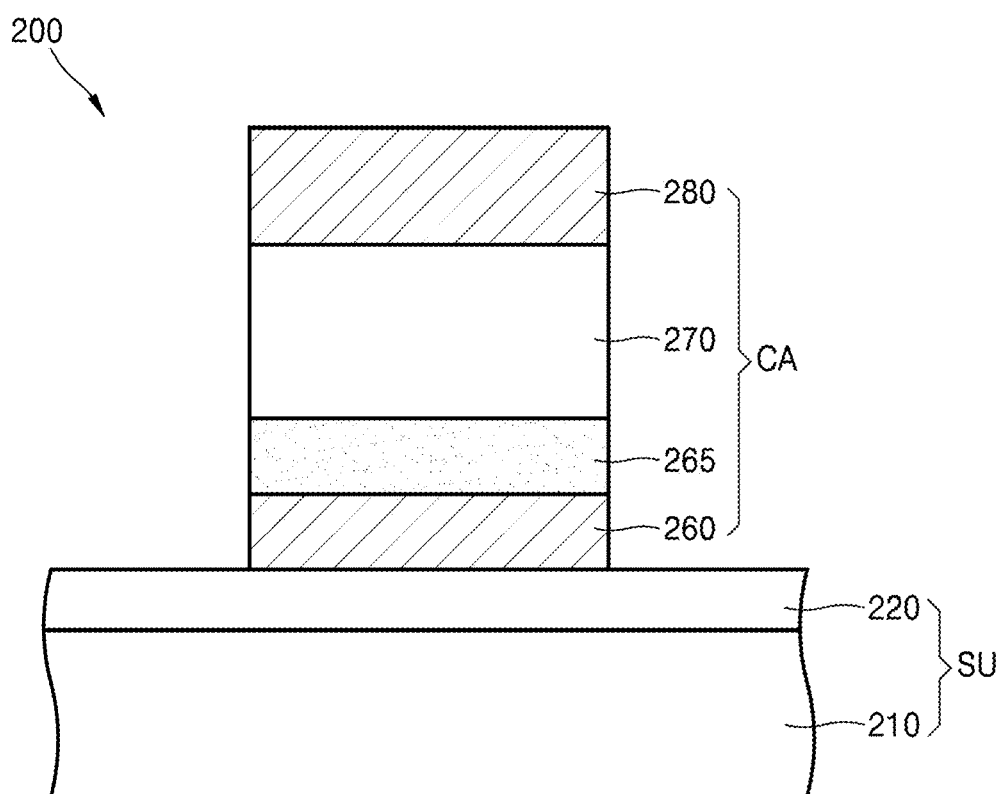

Next, as shown in FIG. 7D, an upper electrode 280 is formed. The upper electrode 280 may include a metal, a metal nitride, a metal oxide, or a combination thereof. The upper electrode 280 may be formed by an ALD process.

Although it is shown in the drawing that the integrated circuit device 200 manufactured in this way includes only one flat capacitor CA, this is a non-limiting example. The integrated circuit device 200 may include a capacitor having a different shape, using the metal nitride film MM'N as a lower electrode material, and may include a plurality of capacitors.

The integrated circuit device 200, which is manufactured, may include a capacitor CA having a small capacitance change due to a bias voltage to exhibit stable electrical performance, and may be advantageous to increase the degree of integration of the integrated circuit device 200.

Figure 8:
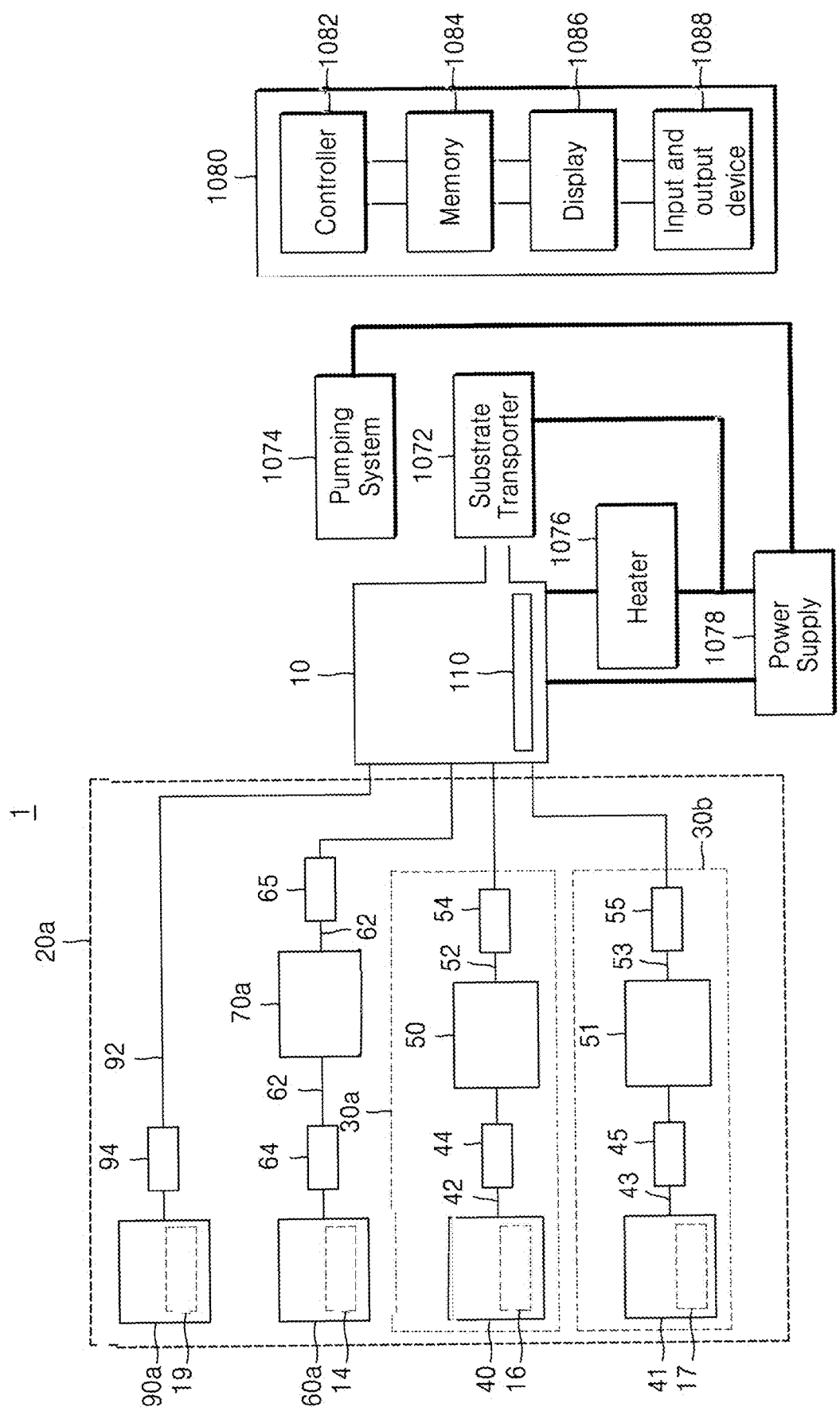
FIG. 8 is a schematic diagram of an apparatus for performing operations of a method of manufacturing a metal nitride film according to some embodiments.

FIG. 8 is a schematic diagram of an apparatus for performing operations of a method of manufacturing a metal nitride film according to some embodiments.

Referring to FIG. 8, an apparatus 1 according to an example embodiment may include a process chamber 10, a process material supply system 20a, and an operation station 1080. Although not shown, the process chamber 10 may include a chamber housing, electrodes (e.g., upper electrode, lower electrode), substrate support (e.g., ESC, clamp) in the chamber housing, and conduits in fluid communication with the process material supply system 20a.

The apparatus 1 may further include a power supply 1078 (e.g., circuit), heater 1076 (e.g., electric circuit heater), substrate transporter 1072 (e.g., robot arm), and pumping system 1074 (e.g., pump) connected to the process chamber 10. The power supply 1078 may provide electric power for operating the process chamber 10, process material supply system 20a, heater 1076, substrate transport 1072, pumping system 1074, and other components of the apparatus 1.

The process chamber 10 may include a valve (e.g., gate valve) that opens when the substrate transporter 1072 transports the substrate 110 into or out of the process chamber 10 and closes when the process chamber 10 performs operations (e.g., vacuum processes, deposition processes).

The process material supply system 20a may include a first source material supply apparatus 30a, a second source material supply apparatus 30b, a nitridant supply apparatus 60a, and a purge gas supply apparatus 90a, but is not limited thereto. The first and second source material supply apparatuses 30a and 30b may include storage containers 16 and 17 (e.g., cannisters) connected to conduits 42 and 43 (e.g., pipes), vaporizers 50 and 51 (e.g., heater circuits), conduits 52 and 53, flow control devices 54 and 55 (e.g., valves).

The storage container 16 may store the MRx source supply (see FIG. 4 operation S330) and the storage container 17 may store the M'Ay source supply (see FIG. 4 operation S360). The first and second source materials 16 and 17 in the first and second source material storage containers 40 and 41 may be transported to the vaporizers 50 and 51 and vaporized in the vaporizers 50 and 51, respectively. For example, the vaporizers 50 and 51 may vaporize the first and second source materials 16 and 17 using heat or pressure (e.g., an atomizer). The first and second source materials 16 and 17 vaporized by the vaporizers 50 and 51 may be supplied to the reaction chamber 10.

The nitridant supply apparatus 60a may be connected to the reaction chamber 10 by the conduit 62, and the conduit 62 may include a flow rate control device 64 (e.g., valve, nozzle) capable of controlling a flow rate of the nitridant 14 (e.g. $NH_3$, $N_2H_2$, $N_3H$, and/or $N_2H_4$). The nitridant 14 may be stored in a canister, cylinder, or other suitable container.

The purge gas supply apparatus 90a may be an apparatus configured to supply the purge gas 19 (e.g., one or more of Ar, He, Ne, or $N_2$ gas) into the reaction chamber 10. The purge gas 19 may be stored in the purge gas supply apparatus 90a and supplied from the purge gas supply apparatus 90a into the reaction chamber 10 through a conduit 92 (e.g., pipe). The purge gas supply apparatus 90a may be connected to the reaction chamber 10 by the conduit 92, and the conduit 92 may include a flow control device 94 (e.g., valve, nozzle) capable of controlling a flow rate of the purge gas 19.

The conduits 42, 43, 52, 53, 62, and 92 may be conduits through which fluids may flow, and the flow rate control devices 44, 54, 64, and 94 may include valve systems capable of controlling the flows of the respective fluids and gases.

The process material supply system 20a may be a system capable of independently supplying the first source material 16, the second source material 17, nitridant 14, and the purge gas 19 into the reaction chamber 10. The process material supply system 20a may be configured to supply the first source material 16, the second source material 17, the nitridant 14, and the purge gas 19 independently to the reaction chamber 10.

The operation station 1080 may control operations of the apparatus 1. The operation station 1080 may include a controller 1082, a memory 1084, a display 1086 (e.g., monitor), and an input and output device 1088. The memory 1084 may include a nonvolatile memory, such as a flash memory, a phase-change random access memory (PRAM), a magneto-resistive RAM (MRAM), a resistive RAM (ReRAM), or a ferro-electric RAM (FRAM), and/or a volatile memory, such as a static RAM (SRAM), a dynamic RAM (DRAM), or a synchronous DRAM (SDRAM). The input and output device 1088 may be a keyboard or a touch screen.

The memory 1084 may store an operating system and may store recipe instructions that include settings (e.g., gas flow rates, temperature, time, power, pressure, etc.) for different manufacturing processes performed by the apparatus 1. The memory 1084 may store recipe instructions for forming a metal nitride film on the substrate 110 according to one or more of the embodiments in FIGS. 4, 5A to 5H, and 7A to 7D of the present application.

The controller 1082 may be, may be implemented with processing circuitry processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. that when, executing recipe instructions stored in the memory 1084 (for one or more of the embodiments in FIGS. 4, 5A to 5H, 6A to 6C, and 7A to 7D) configures the controller 1082 as a special purpose controller that operates the apparatus 1 to form a metal nitride film according to example embodiments on the substrate 110.

Figure 9:
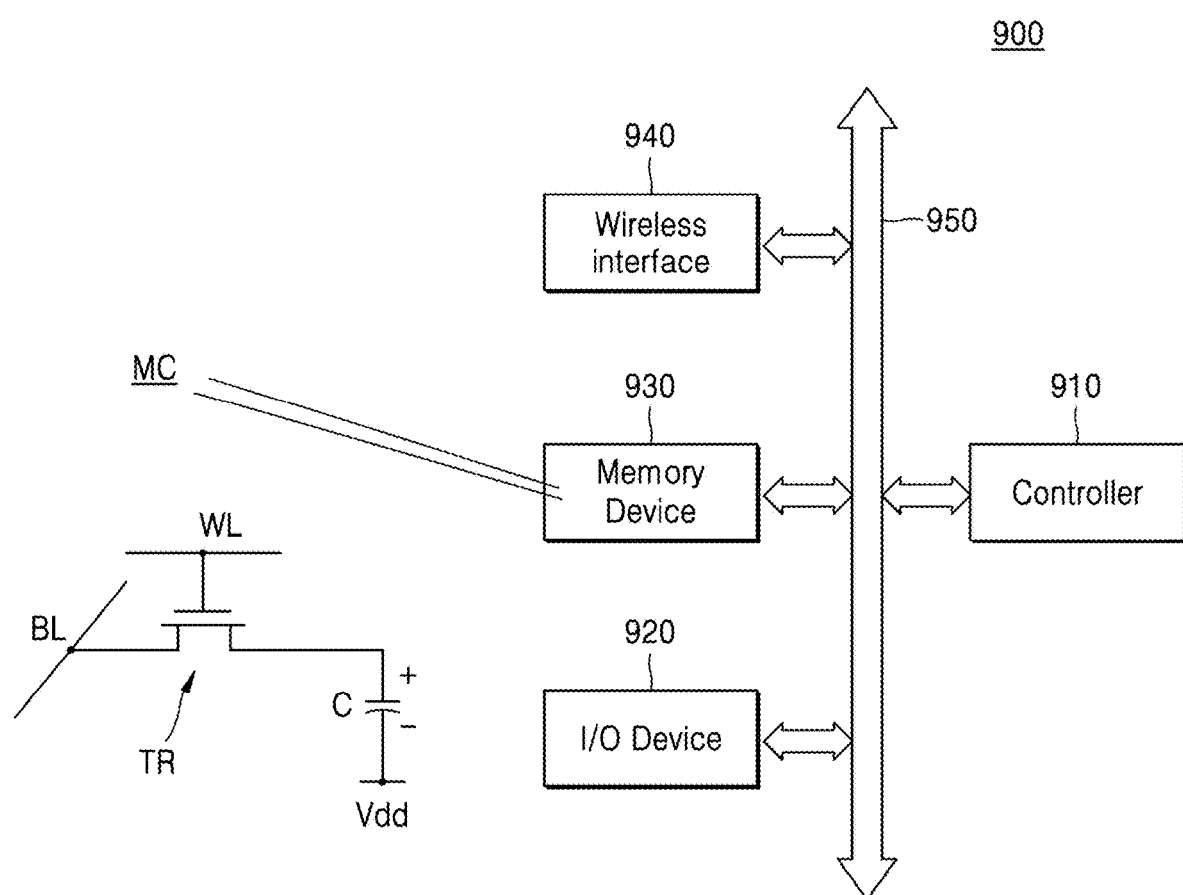
FIG. 9 is a schematic diagram for an electronic device including a capacitor according to some embodiments.

FIG. 9 is a schematic diagram for an electronic device including a capacitor according to some embodiments.

Referring to FIG. 9, an electronic device 900 according to example embodiments of inventive concepts may be a personal digital assistant (PDA), a laptop computer, a portable computer, a web tablet, a wireless phone, a mobile phone, a digital music player, a cable/wireless electronic device, etc., but is not limited thereto. The electronic device 900 may include a controller 910, an input/output (I/O) device 920 (e.g., a keypad, a keyboard and/or a display), a memory device 930, and a wireless interface unit 940 which are combined with each other through a data bus 950. The controller 910 may be implemented with processing circuitry processing circuitry such as hardware including logic circuits; a hardware/software combination such as a processor executing software; or a combination thereof. For example, the processing circuitry more specifically may include, but is not limited to, a central processing unit (CPU), a microprocessor, a digital signal processor, a microcontroller or other logic devices. The other logic devices may have a similar function to any one of the microprocessor, the digital signal processor and the microcontroller. The memory device 930 may store, for example, commands performed by the controller 910. Additionally, the memory device 930 may also be used for storing a user data.

The memory device 930 includes a plurality of memory cells MC. Each of the memory cells MC may include a capacitor C connected to a transistor TR. A word line WL may be connected to a gate of the transistor TR. A bit line BL may be connected one source/drain region of the transistor TR and the capacitor C may be connected to the other source/drain region of the transistor TR. The other end of the capacitor C may be connected to a power supply voltage Vdd. inventive concepts. The capacitor C may include the capacitor 100 described in FIG. 1 of the present application.

The electronic device 900 may use the wireless interface unit 940 in order to transmit data to a wireless communication network communicating with a radio frequency (RF) signal or in order to receive data from the network. For example, the wireless interface unit 940 may include an antenna or a wireless transceiver. The electronic device 900 may be used in a communication interface protocol such as a third generation communication system (e.g., CDMA, GSM, NADC, E-TDMA, WCDAM, and/or CDMA2000).

Figure 10:
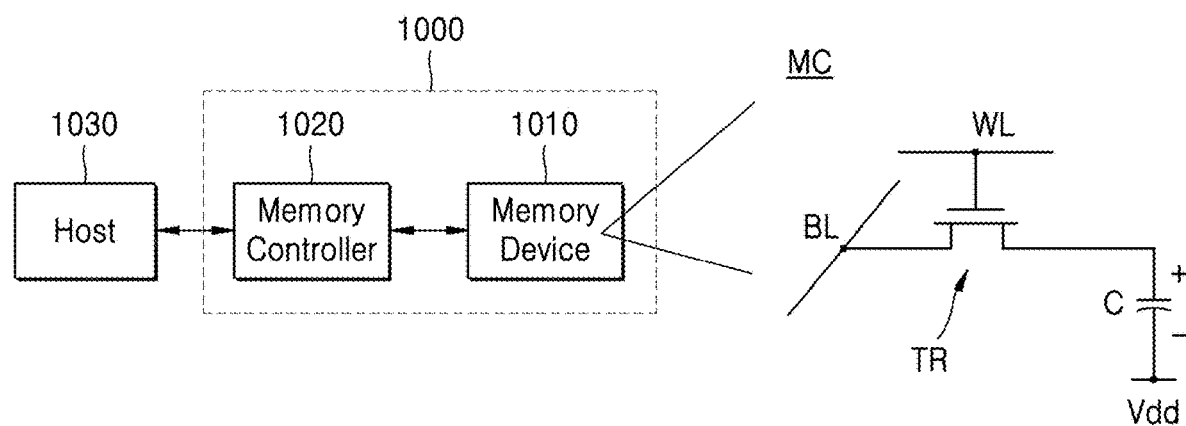
FIG. 10 is a schematic diagram of a memory system including a capacitor according to some embodiments.

FIG. 10 is a schematic diagram of a memory system including a capacitor according to some embodiments.

FIG. 10 is a schematic block diagram illustrating a memory system. Referring to FIG. 10, a memory system 1000 may include a memory device 1010 for storing data and a memory controller 1020. The memory controller 1020 may read or write data from/into the memory device 1010 in response to read/write request of a host 1030. The memory controller 1020 may make an address mapping table for mapping an address provided from the host 1030 (e.g., a mobile device or a computer system) into a physical address of the memory device 1010. The memory controller 1020 may be implemented with processing circuitry processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The memory device 1010 may include a plurality of memory cells MC. Each of the memory cells MC may include a capacitor C connected to a transistor TR, and may have structure that is the same as the memory cell MC described in FIG. 9. The capacitor C may include the capacitor 100 described in FIG. 1 of the present application.

Although the aforementioned capacitor, integrated circuit device, electronic device, memory system, method of manufacturing a metal nitride film, method of manufacturing an integrated circuit device have been described with reference to the embodiment shown in the drawings, and apparatus for performing a method of manufacturing a nitride film and/or an integrated circuit, is the presented embodiments are merely non-limiting examples, and those skilled in the art will understand that various modifications and equivalent other embodiments are possible therefrom. It should be understood that embodiments described herein should be considered in a descriptive sense only and not for purposes of limitation. Therefore, the scope of the present disclosure should not be defined by the described embodiments, but should be determined by the technical spirit described in the following claims.

The aforementioned capacitor has a structure for reducing a depletion layer that may be formed during capacitor operation, and may exhibit good electrical performance.

According to the aforementioned manufacturing method, a metal nitride film including a small amount of impurities and capable of improving the electrical performance of the capacitor when being applied as an electrode material of the capacitor is provided.

According to the aforementioned manufacturing method, an integrated circuit device having high integration and exhibiting good electrical performance is provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A capacitor, comprising:
a lower electrode including a metal nitride represented as MM'N, wherein M is a metal element, M' is an element different from M, and N is nitrogen;
a dielectric layer on the lower electrode;
an interfacial layer between the lower electrode and the dielectric layer, the interfacial layer including a metal nitrate represented by MM'ON, wherein M is the metal element, M' is the element different from M, N is nitrogen, and O is oxygen; and
an upper electrode on the dielectric layer, wherein
in the capacitor, a change range of capacitance C with respect to a bias voltage is represented by $C_{min} \leq C \leq C_{max}$, and $C_{min}/C_{max}$ may be 0.9 or more.

2. The capacitor of claim 1, wherein a content of carbon impurities in the lower electrode is 1% or less.

3. The capacitor of claim 1, wherein a content of carbon impurities in the interfacial layer is 1% or less.

4. The capacitor of claim 1, wherein the M is one of Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U.

5. The capacitor of claim 1, wherein the M' is one of H, Li, Be, B, N, 0, Na, Mg, Al, Si, P, S, K, Ca, Sc, Ti, V, Cr, Mn, Fe, Co, Ni, Cu, Zn, Ga, Ge, As, Se, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U.

6. The capacitor of claim 1, wherein
the metal nitride is represented as $M_xM'_yN_z$,
$0<x\leq2$, $0<y\leq2$, and $0<z\leq4$ are satisfied.

7. An integrated circuit device, comprising:
a substrate; and
the capacitor of claim 1 on the substrate.

8. The integrated circuit device of claim 7, wherein the substrate includes:
a semiconductor substrate;
at least one conductive region on the semiconductor substrate; and
an insulating film insulating on the at least one conductive region.

9. The integrated circuit device of claim 7, further comprising:
a wiring layer, wherein
the capacitor is connected to the wiring layer.

10. The integrated circuit device of claim 7, further comprising:
a contact plug, wherein
the capacitor is connected to the contact plug.

11. An electronic device, comprising:
the capacitor of claim 1 connected to a transistor.

12. A capacitor, comprising:
a lower electrode including a metal nitride represented as $M_xM'_yN_z$, wherein M is a metal element, M' is an element different from M, and N is nitrogen, wherein a content of carbon impurities in the lower electrode is 1% or less, and wherein $0<x\leq2$, $0<y\leq2$, and $0<z\leq4$ are satisfied;

a dielectric layer on the lower electrode; and an upper electrode on the dielectric layer, wherein in the capacitor, a change range of capacitance C with respect to a bias voltage is represented by $C_{min}\leq C\leq C_{max}$, and $C_{min}/C_{max}$ may be 0.9 or more.

13. The capacitor of claim 12, wherein the M is one of Be, B, Na, Mg, Al, Si, K, Ca, Sc, Ti, V, Cr, Mn, Fe, Co, Ni, Cu, Zn, Ga, Ge, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U.

14. The capacitor of claim 12, wherein the M' is one of H, Li, Be, B, N, 0, Na, Mg, Al, Si, P, S, K, Ca, Sc, Ti, V, Cr, Mn, Fe, Co, Ni, Cu, Zn, Ga, Ge, As, Se, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U.

15. The capacitor of claim 13, wherein the M is one of Be, B, Na, Mg, Si, K, Ca, Sc, V, Cr, Mn, Fe, Co, Ni, Cu, Zn, Ga, Ge, Rb, Sr, Y, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Re, Os, Ir, Pt, Au, Hg, Tl, Pb, Bi, Po, Fr, Ra, Ac, Th, Pa, and U.

16. The capacitor of claim 14, wherein the M' is one of H, Li, Be, B, N, O, Na, Mg, P, S, K, Ca, Sc, Ti, V, Cr, Mn, Fe, Co, Ni, Cu, Zn, Ga, Ge, As, Se, Rb, Sr, Y, Zr, Nb, Mo, Tc, Ru, Rh, Pd, Ag, Cd, In, Sn, Sb, Te, Cs, Ba, La, Ce, Pr, Nd, Pm, Sm, Eu, Gd, Tb, Dy, Ho, Er, Tm, Yb, Lu, Hf, Ta, W, Re, Os, Ir, Pt, Au, Hg, Tl, Pb, Bi, Po, Fr, Ra, Ac, Th, Pa, and U.

17. An integrated circuit device, comprising:

a substrate; and the capacitor of claim 12 on the substrate.

18. The integrated circuit device of claim 17, wherein the substrate includes:

a semiconductor substrate;

at least one conductive region on the semiconductor substrate; and an insulating film insulating on the at least one conductive region.

19. The integrated circuit device of claim 17, further comprising:

a wiring layer, wherein the capacitor is connected to the wiring layer.

20. The integrated circuit device of claim 17, further comprising:

a contact plug, wherein the capacitor is connected to the contact plug.

21. An electronic device, comprising:

the capacitor of claim 12 connected to a transistor.

* * * * *